United States Patent
Richling et al.

(10) Patent No.: US 6,721,931 B2
(45) Date of Patent: Apr. 13, 2004

(54) SYSTEM AND METHOD FOR SIMPLIFYING CLOCK CONSTRUCTION AND ANALYSIS

(75) Inventors: Kristin Marie Richling, Fort Collins, CO (US); Gayvin E. Stong, Fort Collins, CO (US); Edgardo Pablo Lopez, Fort Collins, CO (US); Guy Harlan Humphrey, Fort Collins, CO (US); Richard A. Krzyzkowski, Ft. Collins, CO (US); Laurent F. Pinot, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 35 days.

(21) Appl. No.: 10/068,646

(22) Filed: Feb. 5, 2002

(65) Prior Publication Data

US 2003/0149950 A1 Aug. 7, 2003

(51) Int. Cl.[7] .............................................. G06F 17/50
(52) U.S. Cl. ................................ 716/6; 716/4; 716/12; 716/13
(58) Field of Search ................................ 716/1, 4, 5, 6, 716/7, 11, 16, 18, 12, 13, 14

(56) References Cited

U.S. PATENT DOCUMENTS

| | | | |
|---|---|---|---|
| 5,557,779 A | * 9/1996 | Minami | 716/6 |
| 6,006,025 A | * 12/1999 | Cook et al. | 716/14 |
| 6,305,001 B1 | * 10/2001 | Graef | 716/12 |
| 6,311,313 B1 | * 10/2001 | Camporese et al. | 716/6 |
| 6,564,353 B2 | * 5/2003 | Sano | 716/2 |
| 2003/0074642 A1 | * 4/2003 | Haritsa et al. | 716/6 |

* cited by examiner

Primary Examiner—Vuthe Siek
Assistant Examiner—Binh C. Tat

(57) ABSTRACT

A system for simplifying clock construction and distribution within an integrated circuit, and for simplifying analysis within the integrated circuit. The system utilizes a memory, software stored within said memory defining functions to be performed by the system, and a processor. The processor is configured by the software to: read a defined location for a clock generator within the integrated circuit, wherein the clock generator generates a clock signal; read a defined number of interconnect routes to be created within the integrated circuit, wherein a subset of the number of interconnect routes corresponds to a number of logical blocks that will later be provided within the integrated circuit, and wherein each of the interconnect routes within the subset comprises an open end for one of the logical blocks to be placed; test electrical characteristics and functionality of the integrated circuit to ensure that a time for the clock signal to traverse each of the interconnect routes within the subset is equal, and change properties within the integrated circuit if the clock signal traversal time is not equal; and add the logical blocks to each of the interconnect routes within the subset, wherein each of the logical blocks is connected to the open end of one of the interconnect routes within the subset.

20 Claims, 4 Drawing Sheets

SYSTEM AND METHOD FOR SIMPLIFYING CLOCK CONSTRUCTION AND ANALYSIS

FIELD OF THE INVENTION

The present invention generally relates to integrated circuits and, more particularly, is related to simplifying clock construction and clock distribution within an integrated circuit, in addition to simplifying analysis of the clock in the integrated circuit.

BACKGROUND OF THE INVENTION

Many integrated circuits (IC) are synchronous circuits wherein the IC is synchronized by clock signals. Clock signals are typically provided by a clock generator located within the IC that provides clock signals to logical blocks located within the IC. The logical blocks located within the IC differ in accordance with functionality made available by the IC.

Prior to fabrication of an IC, the IC is typically created in software to enable testing of IC electrical characteristics and functionality. To enable testing of the IC, logical blocks within the IC are arranged by a circuit designer in accordance with either, a known predefined schematic, or simply in a random arrangement that allows all logical blocks to fit upon the IC. An example of a program that may be utilized to simulate placement of the logical blocks on the IC is the IC layout tool MAGIC, developed by Berkeley. Of course, other IC layout tools may be utilized as well.

After placement of logical blocks upon the IC, the clock generator is added to the IC and interconnect is mapped within the IC, from the clock generator to the logical blocks, thereby distributing a clock signal to each logical block. Clock signal buffers may be utilized within the IC to assist in driving clock signals to the logical blocks.

After completion of the IC layout, electrical characteristics and functionality of the IC may be tested. An example of an IC simulation program that may be used to test the electrical characteristics and functionality of the IC is simulation program for integrated circuit emphasis (SPICE). Of course, other IC simulation programs may be utilized as well.

It is desirable for the clock signal to arrive at the logical blocks simultaneously to effectively provide a synchronized IC. If, however, the clock signal is received by different logical blocks, at different times, the difference in clock signal arrival time may be accounted for during designing of the IC. While multiple methods may be utilized to compensate for the difference in clock signal arrival time, one method utilized is to account for the difference, or skew, as additional setup or hold time to be added to the IC during design of the IC. An example of a method that may be utilized to add additional setup or hold time to the IC is modifying characteristics of a clock buffer that is utilized to drive the clock signal from the clock generator to the logical blocks.

Since the fabrication method described above requires waiting for placement of logical blocks before clock generator placement and clock signal distribution, testing of the IC can not be effectively performed until after logical blocks have been placed, the clock generator has been placed, and the clock has been distributed from the clock generator to the logical blocks. Unfortunately, requiring a delay to testing of the IC until after placement of logical blocks, the clock generator, and distribution of the clock results in a delay to manufacturing and distribution of the finalized IC.

In addition, since clock distribution is dependent upon placement of the logical blocks, as has been explained above, it is difficult to utilize the same clock distribution pattern for more than one IC. Since the same clock distribution pattern may not be utilized for more than one IC, each new IC demands an allotment of time to design and fabricate a new clock distribution pattern.

SUMMARY OF THE INVENTION

In light of the foregoing, the preferred embodiment of the present invention generally relates to a system for simplifying clock construction and distribution within an IC, and simplifying analysis within the IC.

Generally, with reference to the structure of the clock distribution system, the system utilizes a memory; software stored within the memory defining functions to be performed by the system; and a processor. The processor is configured by the software to perform the steps of: reading a defined location for a clock generator within the integrated circuit, wherein the clock generator generates a clock signal; reading a defined number of interconnect routes to be created within the integrated circuit, wherein a subset of the number of interconnect routes corresponds to a number of logical blocks that will later be provided within the integrated circuit, and wherein each of the interconnect routes within the subset comprises an open end for one of the logical blocks to be placed; testing electrical characteristics and functionality of the integrated circuit to ensure that a time for the clock signal to traverse each of the interconnect routes is equal, and changing properties within the integrated circuit if the clock signal traversal time is not equal; and adding the logical blocks to each of the interconnect routes within the subset, wherein each of the logical blocks is connected to the open end of one of the interconnect routes within the subset.

The present invention can also be viewed as providing a method for simplifying clock construction and analysis of a integrated circuit. In this regard, the method can be broadly summarized by the following steps: defining a location for a clock generator within the integrated circuit, wherein the clock generator generates a clock signal; defining a number of interconnect routes to be created within the integrated circuit, wherein a subset of the number of interconnect routes corresponds to a number of logical blocks that will later be provided within the integrated circuit, and wherein each of the interconnect routes within the subset comprises an open end for one of the logical blocks to be placed; testing electrical characteristics and functionality of the integrated circuit to ensure that a time for the clock signal to traverse each of the interconnect routes is equal, and changing properties within the integrated circuit if the clock signal traversal time is not equal; and adding logical blocks to each of the interconnect routes within the subset, wherein each of the logical blocks is connected to the open end of one of the interconnect routes within the subset.

Other systems and methods of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components of the drawings are

DETAILED DESCRIPTION OF THE PREFERRED EMBODIMENT

The clock distribution system of the present invention can be implemented in software, firmware, hardware, or a combination thereof. In the preferred embodiment of the invention, which is intended to be a non-limiting example, a portion of the clock distribution system is implemented in software that is executed by a computer, for example, but not limited to, a server, a personal computer, work station, minicomputer, or main frame computer.

The software based portion of the clock distribution system, which comprises an ordered listing of executable instructions for implementing logical functions, can be embodied in any computer-readable medium for use by, or in connection with, an instruction execution system, apparatus, or device such as a computer-based system processor containing system, or other system that can fetch the instructions from the instruction execution system, apparatus, or device and execute the instructions. In the context of this document, a "computer-readable medium" can be any means that can contain, store, communicate, propagate or transport the program for use by or in connection with the instruction execution system, apparatus or device.

The computer-readable medium can be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disk read-only memory (CD ROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner, if necessary, and then stored in a computer memory.

Figure 1:
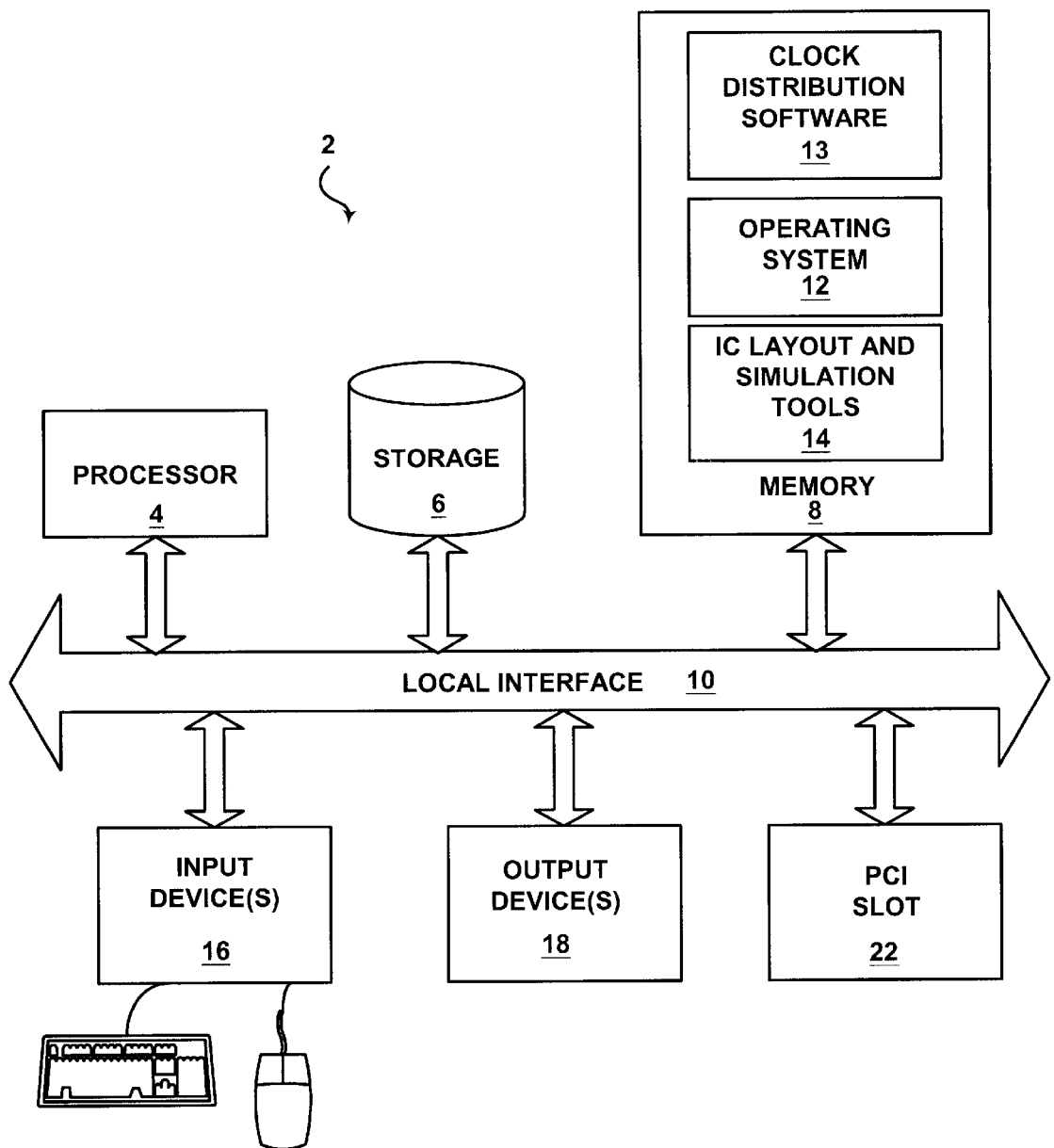
FIG. 1 is a diagram illustrating an embodiment of a computer or processor-based system in which the present clock distribution system may be provided.

Referring now to the drawings, wherein like reference numerals designate corresponding parts throughout the drawings, FIG. 1 is a typical computer or processor-based system 2 in which the clock distribution system may be provided. FIG. 1 shows a computer system 2 generally comprising a processor 4, a storage device 6, and a computer memory 8. The processor 4 accepts data from the computer memory 8 over a local interface 10, such as a bus(es), or a dedicated path.

The memory 8 may have stored therein an operating system 12, such as, but not limited to, Unix®, WindowsNT®, SunSolaris® or any such operating system. The memory 8 may also have IC layout and simulation tools 14 stored therein. An example of an IC layout tool is MAGIC, developed by Berkeley. Of course, other IC layout tools may be utilized as well. As is known by those of ordinary skill in the art, MAGIC is a very large-scale integration (VLSI) layout system. The memory 8 also has clock distribution software stored therein, which defines the functions to be performed by the present clock distribution system.

While the IC layout tool is utilized to create representation of logical blocks in an IC layout, simulation of the IC layout is required to ensure that the created IC has desired electrical characteristics and functionality. Simulation is also necessary, because fabricating an IC is costly in a variety of ways. The process for manufacturing an IC is expensive, therefore it is desirable to minimize the number of times an IC is manufactured from a defective IC layout. After use of the IC layout and simulation tools 14, an IC may be fabricated. An example of an IC is provided by FIG. 2, which is described in detailed below.

The computer system 2 also comprises input device(s) 16 and output device(s) 18. Generally, the computer system 2 may also run any of a number of different platforms. A PCI slot 22 may be attached to the local interface 10 to provide a means for a peripheral device, such as a network interface card (NIC), to attach to the computer system 2.

Figure 2:
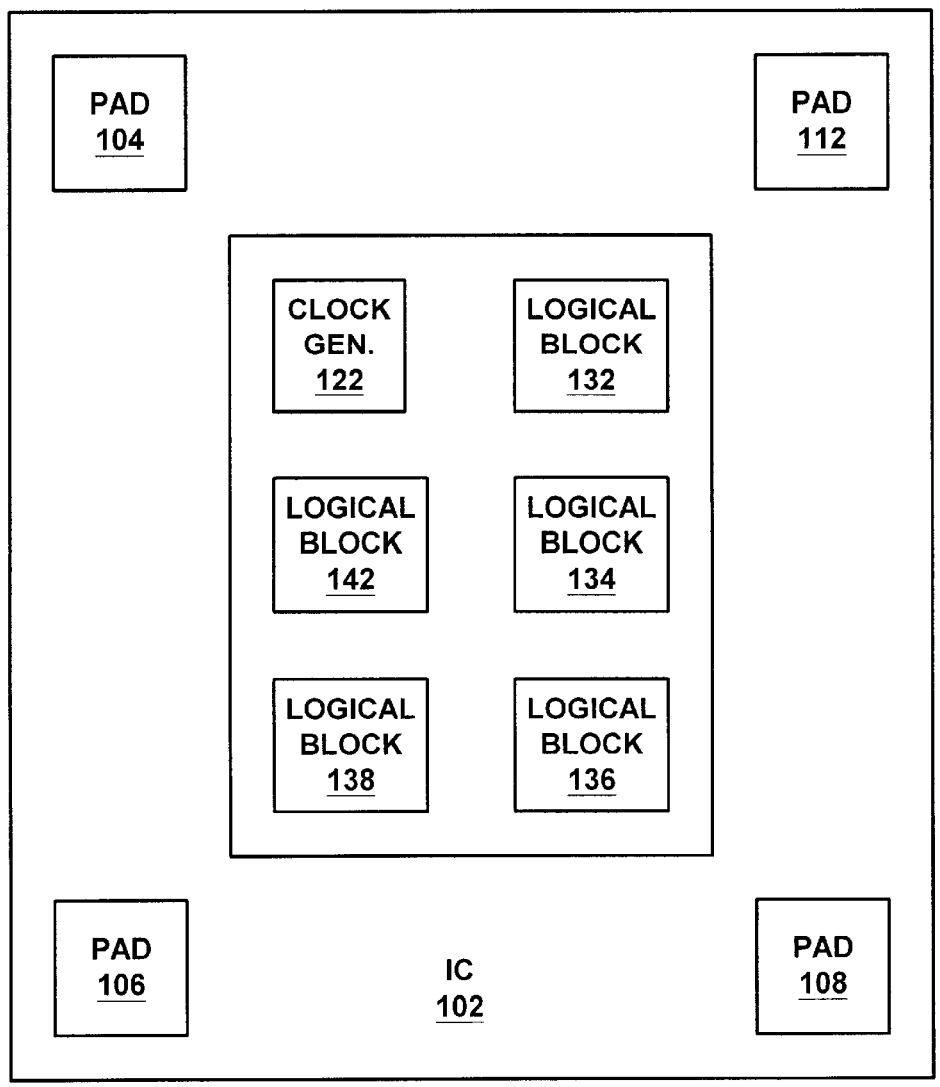
FIG. 2 is a block diagram providing an example of an integrated circuit that may be created and tested by utilizing the integrated circuit layout tool provided by the computer system of FIG. 1.

FIG. 2 is a block diagram providing an example of an IC 102 that may be created and tested by utilizing the IC layout tool 14. As is shown by FIG. 2, the IC 102 comprises a series of pads 104, 106, 108, 112, a clock generator 122, and a series of logical blocks 132, 134, 136, 138, 142. The pads 104, 106, 108, 112, clock generator 122, and logical blocks are connected within the IC 102 via interconnect. The clock generator 122 is connected to the logical blocks 132, 134, 136, 138, 142 for purposes of providing the logical blocks 132, 134, 136, 138, 142 with a clock signal, as well as the pads 104, 106, 108, 112. It should be noted that more than one clock generator may be located within the IC 102. It should also be noted that the term clock generator within this document represents the source of a clock signal.

In accordance with an alternate embodiment of the invention, the clock generator 122 may be located outside of the IC 102. A clock signal may be introduced to the IC 102 via a pad 104, 106, 108, 112, wherein the clock signal may be introduced from a clock chip located on a printed circuit board to which the present IC 102 is connected after fabrication.

Figure 3:
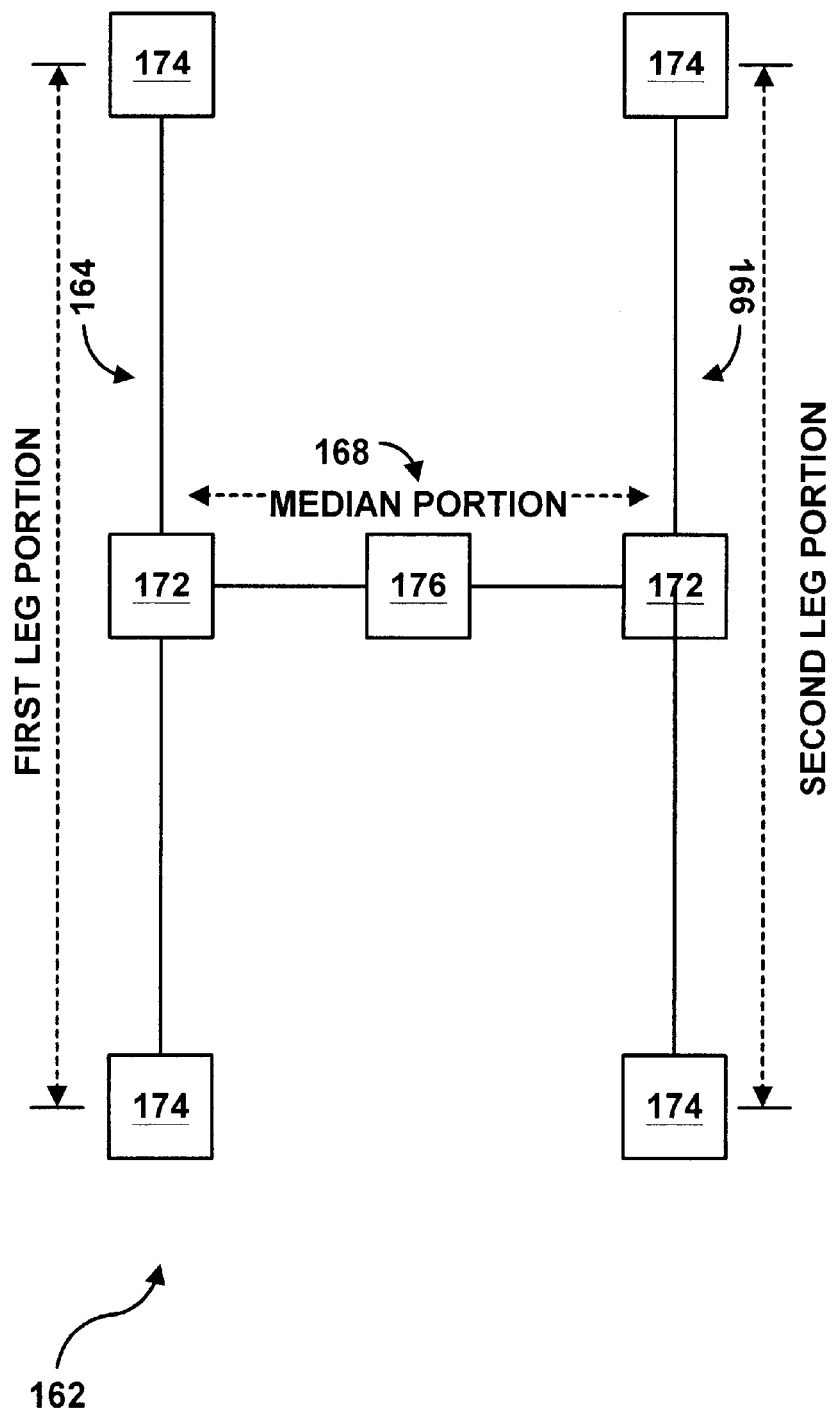
FIG. 3 provides an example of an H-tree clock distribution pattern that may be utilized within the integrated circuit of FIG. 2.

Preferably, an H-tree clock distribution pattern is utilized to distribute a clock signal, that has been created by the clock generator 122, to the logical blocks 132, 134, 136, 138, 142. It should be noted that other clock distribution patterns may also be utilized such as, but not limited to, a T-tree clock distribution pattern. FIG. 3 provides an example of an H-tree clock distribution pattern that may be utilized for distributing the clock signal within the IC 102. The H-tree clock distribution pattern comprises a series of H-tree structures, one of which is illustrated by FIG. 3 for exemplary purposes.

The H-tree structure 162 shown by FIG. 3 comprises a first leg portion 164, a second leg portion 166, and a median portion 168. A first end of the median portion 168 intersects a central portion of the first leg portion 164 at a branch point, while a second end of the median portion 168 intersects a central portion of the second leg portion 166 at a different branch point. As is known by those of ordinary skill in the art, the H-tree structure 162 may be connected to other H-tree structures (not shown) via an end of a leg portion 164, 166. It should be noted that 176 is the input of the H-tree structure 162.

A median portion buffer 172 is provided at each intersection between the median portion 168 and the leg portion 164, 166. In addition, a leg portion buffer 174 is provided at each end of the leg portion 164, 166. The buffers 172, 174 drive a received clock signal to a destination logical block 132, 134, 136, 138, 142. Therefore, use of buffers 172, 174 at the above mentioned locations within the H-tree structure 162 drives clock signals received from the clock generator 122, along the H-tree structure 162, to other H-tree structures (not shown), to the destination logical block 132, 134, 136, 138, 142.

It should be noted herein that the leg portion buffers 174 and/or median portion buffers 172 may be located in different locations. In addition, more, or less leg portion buffers 174 and/or median portion buffers 172 may be provided.

The clock signal is driven from the clock generator 122 (FIG. 2) into a central median portion buffer 176, which is preferably located at the center of the median portion 168. The central median portion buffer 176 comprises logic for controlling the clock signal, which may be tested by utilizing verilog simulations. Such controls may include starting transmission of the clock signal and stopping transmission of the clock signal. The central median portion buffer 176 drives the received clock signal to each median portion buffer 172. The clock signal may then be driven by each median portion buffer 172 to co-located leg portion buffers 174. It should be noted that, if the leg portions 164, 166 are identical in size, then the skew to the buffers 172, 174 will be the same for all four endpoints. Therefore, it is preferred that each leg portion 164, 166 be equivalent in input capacitance.

Since each leg portion 164, 166 is equivalent in size, a fixed length of interconnect is traversed during transmission of the clock signal. Utilizing a fixed length of interconnect, in combination with buffers 172, ensures that equal amounts of clock delay are experienced within the IC 102. Clock delay is further discussed below.

Figure 4:
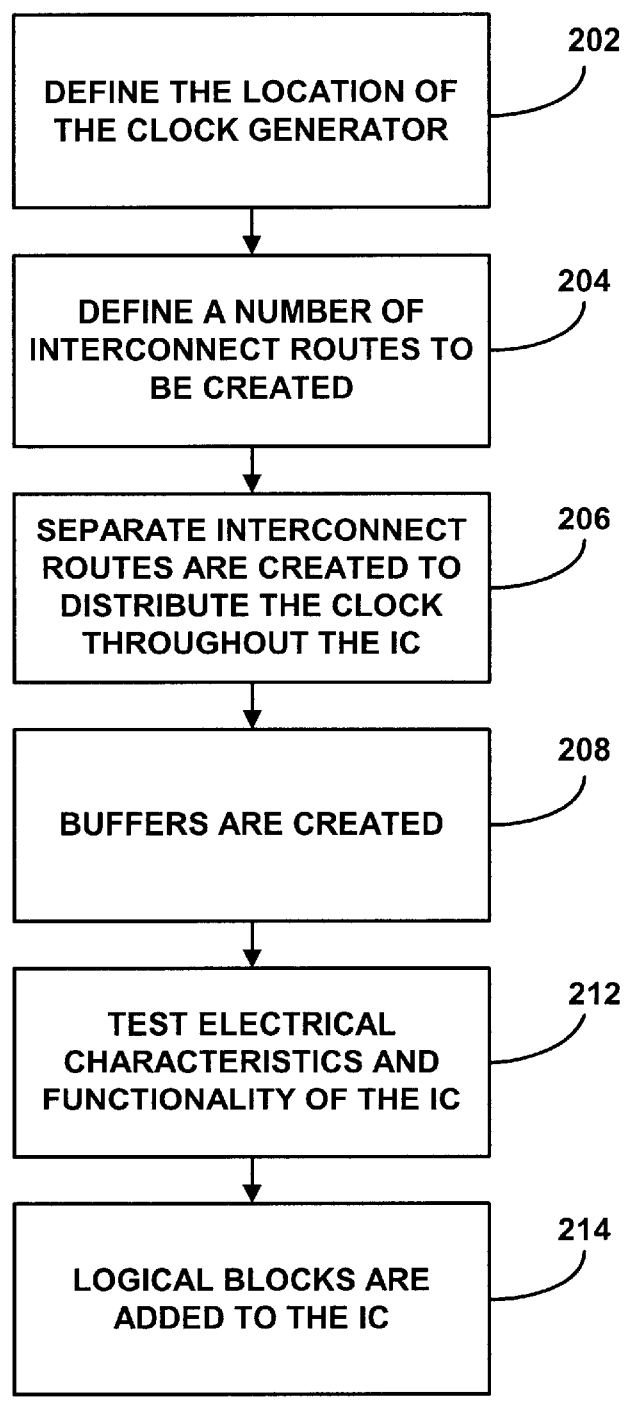
FIG. 4 is a flowchart that shows the architecture, functionality, and operation of a possible implementation of the present clock distribution system.

FIG. 4 is a flowchart that shows the architecture, functionality, and operation of a possible implementation of the clock distribution system. In this regard, each block represents a module, segment, or portion of code, which comprises one or more executable instructions for implementing the specified logical function(s). It should also be noted that in some alternative implementations, the functions noted in the blocks may occur out of the order noted. For example, two blocks shown in succession may in fact be executed substantially concurrently or the blocks may sometimes be executed in the reverse order, depending upon the functionality involved, as will be further clarified hereinbelow.

As shown by block 202, an IC layout tool is utilized to define location of the clock generator 122 within the IC 102 prior to defining location of logical blocks 132, 134, 136, 138, 142. It should be noted that design of the IC 102 may also be performed by hand by a designed of the IC 102. Preferably, a user of the computer system 2 defines the location of the clock generator 122. The user also specifies how many routes of interconnect are to be created (block 204). A subset of the number of routes of interconnect is directly related to the number of logical blocks that will later be provided on the IC 102, with an endpoint of an interconnect route being the future location of a logical block 132, 134, 136, 138, 142. The number of logical blocks may, or may not, be known by the IC designer at the start of IC 102 design. It should be noted that the location of the clock generator 122 may instead be predefined due to pad ring constraints of the IC 102 or other such design constraints.

The IC layout tool then automatically distributes the clock throughout the IC 102 by creating separate interconnect routes (block 206). The IC layout tool preferably utilizes an H-tree distribution pattern to in create the interconnect paths for distributing clock signals throughout the IC 102. The H-tree distribution pattern has been described in detail above. Once again, it should be noted that other distribution patterns may be utilized by the IC layout tool 14 (FIG. 1).

As shown by block 208, the IC layout tool 14 (FIG. 1) automatically creates: median portion buffers 172 (FIG. 3) at each intersection between a median portion 168 (FIG. 3) and a leg portion 164, 166 (FIG. 3); leg portion buffers 174 (FIG. 3) at each end of a leg portion 164, 166 (FIG. 3); and central median portion buffers 176 (FIG. 3) at the center of a median portion 168 (FIG. 3). The buffers 172, 174, 176 (FIG. 3) provide clock-driving capability to the IC 102.

After the IC layout tool 14 (FIG. 1) has been utilized for the above mentioned purposes, the simulation tool is utilized to test electrical characteristics and functionality within the IC 102 (block 212). Recall that at this point, the logical blocks 132, 134, 136, 138, 142 still have not been provided within the IC 102 layout. Therefore, at this point in time a clock block has been defined comprising the clock generator 122, clock distribution throughout the IC, and buffers 172, 174, 176.

During simulation of the IC 102, having the clock generator 122, interconnects, and buffers 172, 174, 176 defined therein, the amount of time required for the clock signal to travel from the clock generator 122 to each individual endpoint within each individual route of interconnect is determined. As mentioned above, it is desirable that the required clock signal traversal times be equal for each individual route of interconnect. If, however, the clock signal traversal time from the clock generator 122 to each individual endpoint is not equal, interconnect routes and/or buffer 172, 174, 176 properties may be changed until the clock signal traversal times are equal.

Typically, a mismatch in clock signal traversal time indicates that interconnects were not routed identically, wherein one route of interconnect may be shorter than another route, or wider than another route. One issue that could cause a difference in clock signal traversal times wherein the interconnect routes are identical, is capacitive coupling. A difference in capacitive coupling within the IC 102 can arise if spaces between clock wires (not shown) and logical wires (not shown) within the IC 102 differ. To avoid the issue of capacitive coupling, shield wires (i.e., ground wires (GND) and power wires (VDD)) may be placed on each side of the clock wires to guarantee that coupling is identical at each interconnect leg portion 164, 166.

Defining the clock generator 122, clock distribution pattern, and buffers 172, 174, 176, prior to allocation of logical blocks 132, 134, 136, 138, 142, and simulation of the IC 102 prior to allocation of logical blocks 132, 134, 136, 138, 142, allows for minimizing critical path design time required to tune the clock generator 122 and clock distribution. As is known in the art, critical path is when a step in IC 102 design and/or fabrication is preventing public release of the IC 102. Minimizing critical path design time potentially speeds design of the IC 102, allowing for minimal delay before fabrication and quicker time to marketing the IC 102.

As shown by block 214, the logical blocks 132, 134, 136, 138, 142 are added to the IC 102 at the endpoints of interconnect routes as they become available. Electrical characteristics and/or functionality of the IC 102 may then be tested. After testing the IC 102, tuning of the clock tree may be performed by utilizing the methods provided above. It should be noted that tuning of the clock tree may not be necessary. In addition, it is possible for all logical blocks 132, 134, 136, 138, 142 to be available at once, resulting in all logical blocks 132, 134, 136, 138, 142 being added at once, prior to testing of the IC 102.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The following is claimed:

1. A method of simplifying clock construction and analysis of an integrated circuit, comprising the steps of:
    defining a location for a clock generator within said integrated circuit, wherein said clock generator generates a clock signal;
    defining a number of interconnect routes to be created within said integrated circuit, wherein a subset of said number of interconnect routes corresponds to a number of logical blocks that will later be provided within said integrated circuit, and wherein each of said interconnect routes within said subset comprises an open end for one of said logical blocks to be placed;
    testing electrical characteristics and functionality of said integrated circuit to ensure that a time for said clock signal to traverse each of said interconnect routes is equal, and changing properties within said integrated circuit if said clock signal traversal time is not equal; and
    adding one of said logical blocks to each one of said interconnect routes within said subset after the steps of defining the location for a clock generator, defining the number of interconnect routes to be created, and testing the electrical characteristics and functionality, wherein each said logical block is connected to said open end of one of said interconnect routes within said subset.

2. The method of claim 1, wherein said step of defining said location of said clock generator and said step of defining a number of said interconnect routes is performed via use of a circuit layout program.

3. The method of claim 1, further comprising the step of:
    distributing said clock signal throughout said integrated circuit by creating said interconnect routes within said integrated circuit.

4. The method of claim 3, further comprising the step of:
    creating buffers within said interconnect routes within said subset for driving said clock signal to said logical blocks, wherein said interconnect routes are provided utilizing an H-tree distribution pattern.

5. The method of claim 4, wherein said H-tree distribution pattern comprises a median portion and two leg portions, wherein said median portion intersects a middle of said leg portions, and wherein said step of automatically creating said buffers further comprises the steps of:
    creating a median portion buffer at each intersection between said median portion and one of said leg portions;
    creating a leg portion buffer at each end of said leg portion; and
    creating a central median portion buffer at a center of said median portion,
        wherein said buffers provide clock driving capability to said integrated circuit from said clock generator to said logical blocks.

6. The method of claim 5, wherein said step of changing properties within said integrated circuit if said clock signal traversal time is not equal, further comprises the step of:
    changing properties of said buffers and said interconnect.

7. A system for simplifying clock construction and analysis of an integrated circuit, comprising:
    a memory;
    software stored within said memory defining functions to be performed by said system; and
    a processor, wherein said processor is configured by said software to perform the steps of:
        reading a defined location for a clock generator within said integrated circuit, wherein said clock generator generates a clock signal;
        reading a defined number of interconnect routes to be created within said integrated circuit, wherein a subset of said number of interconnect routes corresponds to a number of logical blocks that will later be provided within said integrated circuit, and wherein each of said interconnect routes within said subset comprises an open end for one of said logical blocks to be placed;
        testing electrical characteristics and functionality of said integrated circuit to ensure that a time for said clock signal to traverse each of said interconnect routes within said subset is equal, and changing properties within said integrated circuit if said clock signal traversal time is not equal; and
        adding one of said logical blocks to each one of said interconnect routes within said subset after the steps of reading a defined location for a clock generator, reading a defined the number of interconnect routes to be created, and testing the electrical characteristics and functionality, wherein each said logical block is connected to said open end of one of said interconnect routes within said subset.

8. The system of claim 7, wherein said location of said clock generator and said number of interconnect routes is provided via a circuit layout program.

9. The system of claim 7, wherein said processor is further configured by said software to perform the step of:
    distributing said clock signal throughout said integrated circuit by creating said interconnect routes within said integrated circuit.

10. The system of claim 9, wherein said processor is further configured by said software to perform the step of:
    creating buffers within said interconnect routes for driving said clock signal to said logical blocks, wherein said interconnect routes are provided utilizing an H-tree distribution pattern.

11. The system of claim 10, wherein said H-tree distribution pattern comprises a median portion and two leg portions, wherein said median portion intersects a middle of said leg portions, and wherein said step of automatically creating said buffers further comprises the steps of:

creating a median portion buffer at each intersection between said median portion and one of said leg portions;

creating a leg portion buffer at each end of said leg portion; and creating a central median portion buffer at a center of said median portion, wherein said buffers provide clock driving capability to said integrated circuit from said clock generator to said logical blocks.

12. The system of claim 11, wherein said step of changing properties within said integrated circuit if said clock signal traversal time is not equal, further comprises changing properties of said buffers.

13. The system of claim 7, wherein said processor is further configured by said software to performed the step of:

testing electrical characteristics and functionality of said integrated circuit after said logical blocks have been added to said integrated circuit.

14. The system of claim 7, wherein said processor is further configured by said software to performed the step of:

testing electrical characteristics and functionality of said integrated circuit prior to addition of all of said logical blocks to said integrated circuit.

15. A system for simplifying clock construction and analysis of an integrated circuit, comprising:

means for reading a defined location for a clock generator within said integrated circuit, wherein said clock generator generates a clock signal;

means for reading a defined number of interconnect routes to be created within said integrated circuit, wherein a subset of said number of interconnect routes corresponds to a number of logical blocks that will later be provided within said integrated circuit, and wherein each of said interconnect routes within said subset comprises an open end for one of said logical blocks to be placed;

means for testing electrical characteristics and functionality of said integrated circuit to ensure that a time for said clock signal to traverse each of said interconnect routes within said subset is equal, and changing properties within said integrated circuit if said clock signal traversal time is not equal; and means for adding one of said logical blocks to each one of said interconnect routes within said subset after the defined location for a clock generator has been read, after defined number of interconnect routes have been created, and after the electrical characteristics and functionality have been tested, wherein each said logical block is connected to said open end of one of said interconnect routes within said subset.

16. The system of claim 15, further comprising:

means for distributing said clock signal throughout said integrated circuit by creating said interconnect routes within said integrated circuit.

17. The system of claim 15, further comprising:

means for automatically creating buffers within said interconnect routes within said subset for driving said clock signal to said logical blocks, wherein said interconnect routes within said subset are provided utilizing an H-tree distribution pattern.

18. The system of claim 17, wherein said H-tree distribution pattern comprises a median portion and two leg portions, wherein said median portion intersects a middle of said leg portions, and wherein said further comprises:

means for creating a median portion buffer at each intersection between said median portion and one of said leg portions;

means for creating a leg portion buffer at each end of said leg portion; and means for creating a central median portion buffer at a center of said median portion, wherein said buffers provide clock driving capability to said integrated circuit from said clock generator to said logical blocks.

19. The system of claim 18, wherein said changing properties within said integrated circuit if said clock signal traversal time is not equal, further comprises changing properties of said buffers.

20. The system of claim 15, wherein said location of said clock generator and said number of interconnect routes is provided via a circuit layout program.

* * * * *